United States Patent
Forman et al.

(10) Patent No.: US 12,224,757 B2
(45) Date of Patent: Feb. 11, 2025

(54) METHOD AND APPARATUS FOR REDUCING JITTER IN A PHASE-LOCKED LOOP

(71) Applicant: ESS Technology, Inc., San Jose, CA (US)

(72) Inventors: Dustin Dale Forman, Kelowna (CA); Libin Timothy George, Kelowna (CA); Hassan Mohammadnavazi, Kelowna (CA); Hu Jing Yao, Kelowna (CA)

(73) Assignee: ESS Technology, Inc., Milpitas, CA (US)

(*) Notice: Subject to any disclaimer, the term of this patent is extended or adjusted under 35 U.S.C. 154(b) by 26 days.

(21) Appl. No.: 18/117,795

(22) Filed: Mar. 6, 2023

(65) Prior Publication Data

US 2024/0305304 A1    Sep. 12, 2024

(51) Int. Cl.
*H03L 7/091* (2006.01)
*H03L 7/089* (2006.01)
*H03L 7/099* (2006.01)

(52) U.S. Cl.
CPC ............ *H03L 7/091* (2013.01); *H03L 7/0891* (2013.01); *H03L 7/099* (2013.01)

(58) Field of Classification Search
CPC ... H04L 7/033; H03L 7/08; H03L 7/06; H03L 7/091; H03L 7/0891; H03L 7/099
See application file for complete search history.

(56) References Cited

U.S. PATENT DOCUMENTS

| | | | | |
|---|---|---|---|---|
| 6,784,751 | B2* | 8/2004 | Salmi | H03K 21/08 331/16 |
| 7,230,461 | B1* | 6/2007 | Savoj | H03L 7/183 327/90 |
| 9,577,646 | B1* | 2/2017 | Pandita | H03L 7/1976 |
| 9,853,635 | B2* | 12/2017 | Lin | H03B 5/1246 |
| 2019/0346877 | A1* | 11/2019 | Allan | H03L 7/1976 |

FOREIGN PATENT DOCUMENTS

WO    WO-2009110715 A2 *  9/2009   ............. H03L 7/087

* cited by examiner

*Primary Examiner* — Sophia Vlahos
(74) *Attorney, Agent, or Firm* — Gard & Kaslow LLP

(57) ABSTRACT

A method and apparatus for reducing jitter in a phase-locked loop (PLL). Clock signals provided to the PLL are resampled into the voltage domain of the VCO in the PLL rather than being merely level shifted into that voltage domain or input directly from digital domain clock dividers as in the prior art. The resampling is done with flip-flops in the analog domain using a faster synchronous clock in each case, and results in cleaner clock edges being presented to the PLL than those provided by the digital circuitry alone. A divided input clock signal is resampled using the undivided input clock, while a divided feedback clock signal is resampled using the feedback clock signal itself, i.e., the output of the VCO in the PLL. This removes jitter caused by the processing of clock signals in the digital voltage domain and thus reduces the jitter in the output signal.

16 Claims, 5 Drawing Sheets

METHOD AND APPARATUS FOR REDUCING JITTER IN A PHASE-LOCKED LOOP

FIELD OF THE INVENTION

The present invention relates generally to signal processing circuits, and more specifically to phase-locked loops.

BACKGROUND OF THE INVENTION

A phase-locked loop (PLL) is a feedback control system in which the phase of a locally generated signal is automatically matched to the phase of an input periodic signal by producing an oscillator frequency to match the frequency of the input signal. PLLs are often used to generate, stabilize, modulate, demodulate, filter or recover a signal from a communications channel with noise, in, for example, wireless or radio frequency (RF) applications.

While there are several different types of PLLs, the simplest PLL consists of a phase detector and a variable frequency oscillator in a "negative feedback" loop. The frequency and phase of the oscillator are controlled proportionally by an applied voltage, and the oscillator is thus known as a voltage-controlled oscillator (VCO). The VCO generates a periodic signal of a specific frequency as an output signal; that VCO output signal is fed back to the phase detector, which compares the phase of the fed back output signal to the phase of the input signal. The result of this comparison is used to adjust the VCO to keep the phases matched.

In addition to matching the phases of the input signal and the fed-back signal from the VCO, the frequencies of the signals are related. Thus, as well as synchronizing the phases of the signals, a PLL can generate an output frequency that is the same as, or a ratio of, the input frequency.

However, a common issue in PLL circuits is jitter. Jitter is a statistical measure of the deviation of the actual PLL clock edges from ideal clock edges in time. Causes of jitter may include supply and substrate noise, transistor device noise (mainly thermal and flicker noise), and jitter in the reference signal.

The clock functions in a PLL circuit typically occur in a digital domain, while the actual PLL uses analog components. There is typically more noise in the digital domain due to the high-frequency switching of the digital circuitry, such as the high-to-low and low-to-high transitions of digital devices such as logic gates, flip-flops, etc.), In some implementations the analog circuitry may operate in a higher voltage domain than the digital circuitry; in such cases, the power supply for the low-voltage domain may have more noise than that for the higher voltage analog domain, and. signals that go from one voltage domain to the other must thus be shifted in level, which can result in additional noise. Even if the voltage levels are the same, shifting across the power supply boundary may still result in additional noise. Since the loop in the PLL operates to integrate an input signal, once noise is present in the PLL it is difficult or impossible to remove. This noise is also expressed as jitter in the output of the PLL.

It would be desirable to be able to construct and operate a PLL in a way that reduces jitter in the output.

SUMMARY OF THE INVENTION

Described herein is a method and apparatus for reducing jitter in a phase-locked loop.

One embodiment discloses a phase-locked loop circuit comprising: a digital voltage circuit configured to: receive a loop feedback signal; generate a divided feedback signal from the loop feedback signal; and generate an output frequency signal from the loop feedback signal; a clock resampling circuit configured to: receive the loop feedback signal and the divided feedback signal; generate a resampled feedback signal by resampling the divided feedback signal using the loop feedback signal; an analog circuit feedback loop comprising: a phase detector configured to: receive a reference clock signal and the resampled feedback signal; and generate a phase comparison signal by comparing a phase of the reference clock signal to a phase of the resampled feedback signal; a low pass filter configured to receive and filter the phase comparison signal; and a voltage controlled oscillator configured to: receive the filtered phase comparison signal; and generate the loop feedback signal from the filtered phase comparison signal; and an output voltage circuit configured to generate a clock output signal from the output frequency signal.

In one further embodiment of the phase-locked loop circuit, the reference clock signal is an undivided signal.

In another further embodiment of the phase-locked loop circuit, the digital voltage circuit is further configured to: receive an input clock signal from an input clock circuit; and generate a divided input clock signal by dividing the input clock signal; and the clock resampling circuit is further configured to: receive the divided input clock signal and the input clock signal; and generate the reference clock signal by resampling the divided input clock signal using the input clock signal.

Another embodiment discloses a method of operating a phase-locked loop circuit comprising: receiving, at a digital voltage circuit, a loop feedback signal; generating, by the digital voltage circuit, a divided feedback signal from the loop feedback signal, and an output frequency signal from the loop feedback signal; comparing, by a phase comparator, a phase of a reference clock signal to a phase of a resampled feedback signal, thereby generating a phase comparison signal; filtering, by a low pass filter, the phase comparison signal, thereby generating a filtered phase comparison signal; generating, by a voltage controlled oscillator, the loop feedback signal from the filtered phase comparison signal; dividing, by the digital voltage circuit, the loop feedback signal, thereby generating the divided feedback signal; resampling, by a resampling circuit, the divided feedback signal, thereby generating the resampled feedback signal; and generating a clock output signal from the output frequency signal.

In one further embodiment of the method, the reference clock signal is an undivided signal.

In another further embodiment, the method further comprises receiving, at the digital voltage circuit, an input clock signal from an input clock circuit; generating a divided input clock signal by dividing the input clock signal; receiving, in the resampling circuit, the divided input clock signal and the input clock signal; and generating the reference clock signal by resampling the divided input clock signal using the input clock signal.

DETAILED DESCRIPTION OF THE INVENTION

Described herein is a method and apparatus for reducing jitter in a phase-locked loop (PLL). In the following discussion, the PLL is the phase-locked loop itself while a PLL circuit includes a PLL and other supporting circuitry.

In the present approach, any clock signals provided to the PLL portion of the circuit by a digital circuit are resampled into the voltage domain of the VCO of the PLL rather than being merely level-shifted into that voltage domain or input directly from digital domain clock dividers as in the prior art. In one embodiment, the resampling is done with flip-flops in the analog domain using the best clocks available, i.e., faster clocks that are synchronous in phase, which results in cleaner clock edges being presented to the PLL than those provided by the digital clock circuitry alone. A divided input clock signal is resampled using the undivided input clock, while a divided feedback clock signal is resampled using the loop feedback clock signal itself, i.e., the output of the VCO in the PLL. This removes jitter caused by the processing of clock signals in the digital voltage domain and thus reduces the jitter in the output signal.

The resampling results in a transfer from a "noisy" voltage supply domain to a "clean" one in which the amount of circuitry running on the voltage supply is minimized by locating the clock dividers outside the PLL voltage domain. Resampling the divided feedback signal in the same voltage domain that contains the VCO ensures that the signal is in the correct domain for phase comparison, and that the VCO timing is used to determine the feedback timing. This also ensures that the jitter from the VCO defines the amount of jitter in the feedback signal, rather than the amount of jitter in the digital voltage domain.

Figure 1:
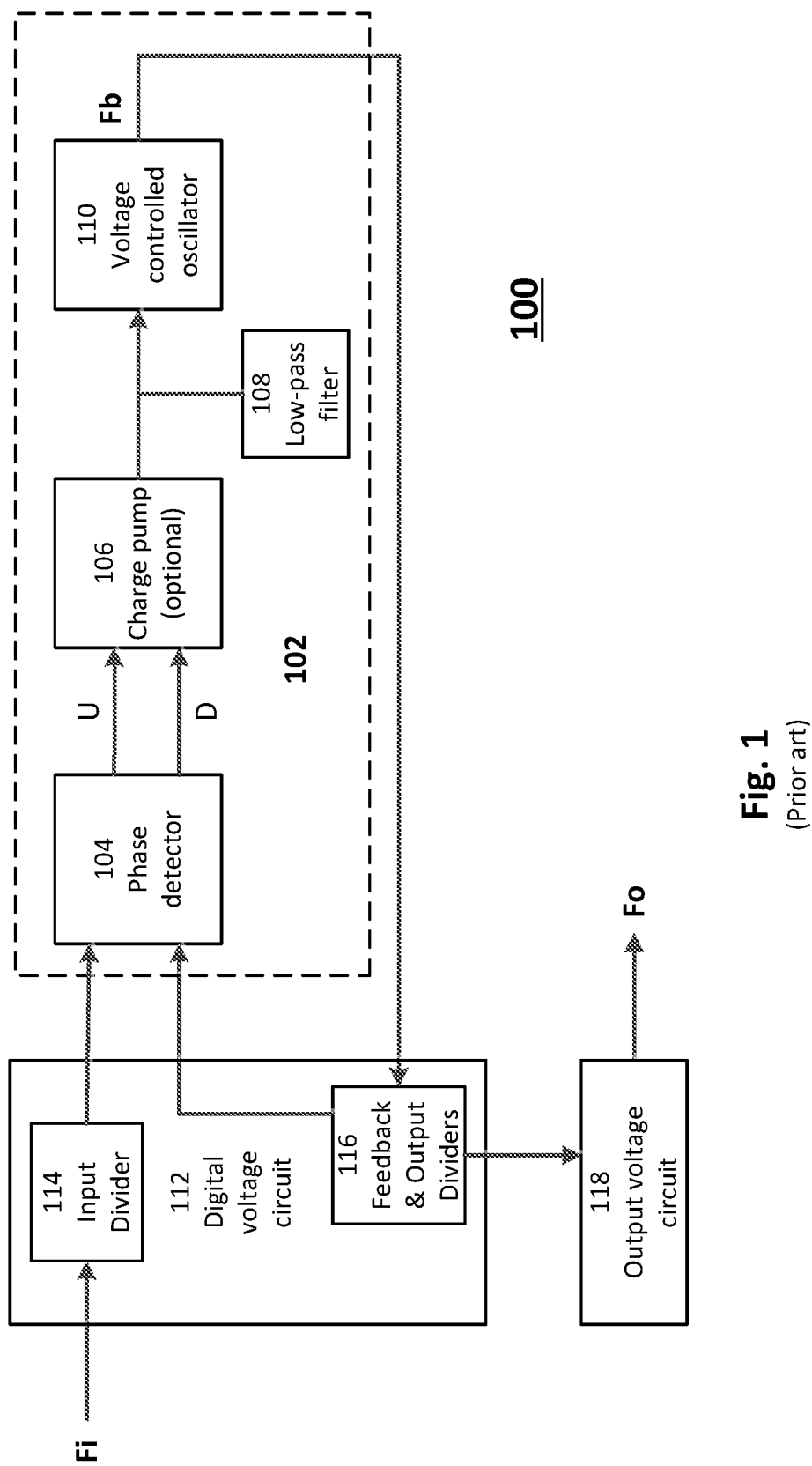
FIG. 1 is a block diagram of one type of phase-locked loop circuit as is known in the prior art.

FIG. 1 is a block diagram of one type of PLL circuit 100 as is known in the prior art. PLL circuit 100 contains a PLL 102, a digital voltage circuit 112, and an output voltage circuit 118.

PLL 102 is comprised of analog components and contains a phase detector 104, an optional charge pump 106, a low pass filter 108, and a voltage controlled oscillator (VCO) 110. The phase detector 104 compares the phase of a reference clock signal, here an input clock signal Fi, to the phase of a feedback clock signal Fb (the feedback clock signal is divided in frequency before being received by phase detector 104, and the input clock signal may also be divided, as described below), and generates an "error," or difference, signal, i.e., a voltage according to the difference between them.

The resulting difference signal from phase detector 104 is passed through a low-pass filter 108, resulting in a varying control voltage. This control voltage drives the VCO 110; as it increases or decreases, it respectively increases or decreases the output frequency of the VCO, thus pulling the output frequency of the VCO toward the input frequency until it cannot reduce the error further. If the VCO output frequency exactly matches the input frequency, the phase difference becomes zero.

Some PLL implementations include a charge pump 106; a charge pump is one way in which the PLL can derive the control voltage that drives the VCO from the phase detection. In a charge-pump PLL (CP-PLL), the phase detector output is a current source as opposed to a voltage source and "pumps" current into and out of the phase-locked loop 102, so that charge pump 106 and low pass filter 108 effectively integrate the current. This form of PLL is popular because it is adaptable to inclusion in microcircuit devices.

In some implementations, phase detector 104 may receive the input clock signal undivided as a reference signal, but as illustrated in FIG. 1 digital voltage circuit 112 receives the input clock signal Fi, divides its frequency at input divider 114, and provides the divided clock signal to phase detector 104 in PLL 102. In some implementations, digital voltage circuit 112 may use a low voltage level and PLL 102 use a higher voltage level; in such implementations, level shifting occurs both in providing the input clock Fi to phase detector 102 and in receiving the output of VCO 110. For example, some current devices use 1.2 volts for digital voltage circuit 112 and 1.8 volt for PLL 102. In other implementations, digital voltage circuit 112 and PLL 102 may use the same voltage.

The output of VCO 110 is a loop feedback clock signal Fb that is also divided in frequency by a feedback and output divider 116 before being fed to phase detector 104 to be compared to the divided input signal as described above. The divided feedback signal is also provided to output voltage circuit 118 which uses it to generate a clock output signal Fo. While FIG. 1 illustrates a single feedback and output divider 116 for simplicity, in many implementations the output divider is separate from the feedback divider, with the feedback divider within the feedback loop and the output divider outside the feedback loop.

In what is known in the art as an "integer-N" PLL, the dividers only divide the frequencies by integers. Thus, VCO 110 can only generate frequencies that are integer ratios of the input frequency. A feedback and output divider 116 in digital voltage circuit 112 is provided to divide the output of VCO 110 so that the two signals provided to phase detector 104 are of about the same frequency (and would be the same frequency in a case in which the phase error could be reduced to zero).

In an integer-N PLL, the output frequency is limited to steps of the frequency input to the phase detector. In other known approaches, known as "fractional-N" PLLs, the PLL output can step through smaller fractions of the phase detector frequency. Such fractional-N PLLs are well known in the art; in some known approaches a sigma-delta modulator may be part of feedback and output divider 116 to do this, or more complex dividers may be used, while in other known approaches separate dividers are employed.

Output voltage circuit 118 receives the divided feedback signal from the digital voltage circuit 112 and prepares clock output signal Fo from the divided feedback signal, as will be explained further below.

Figure 2:
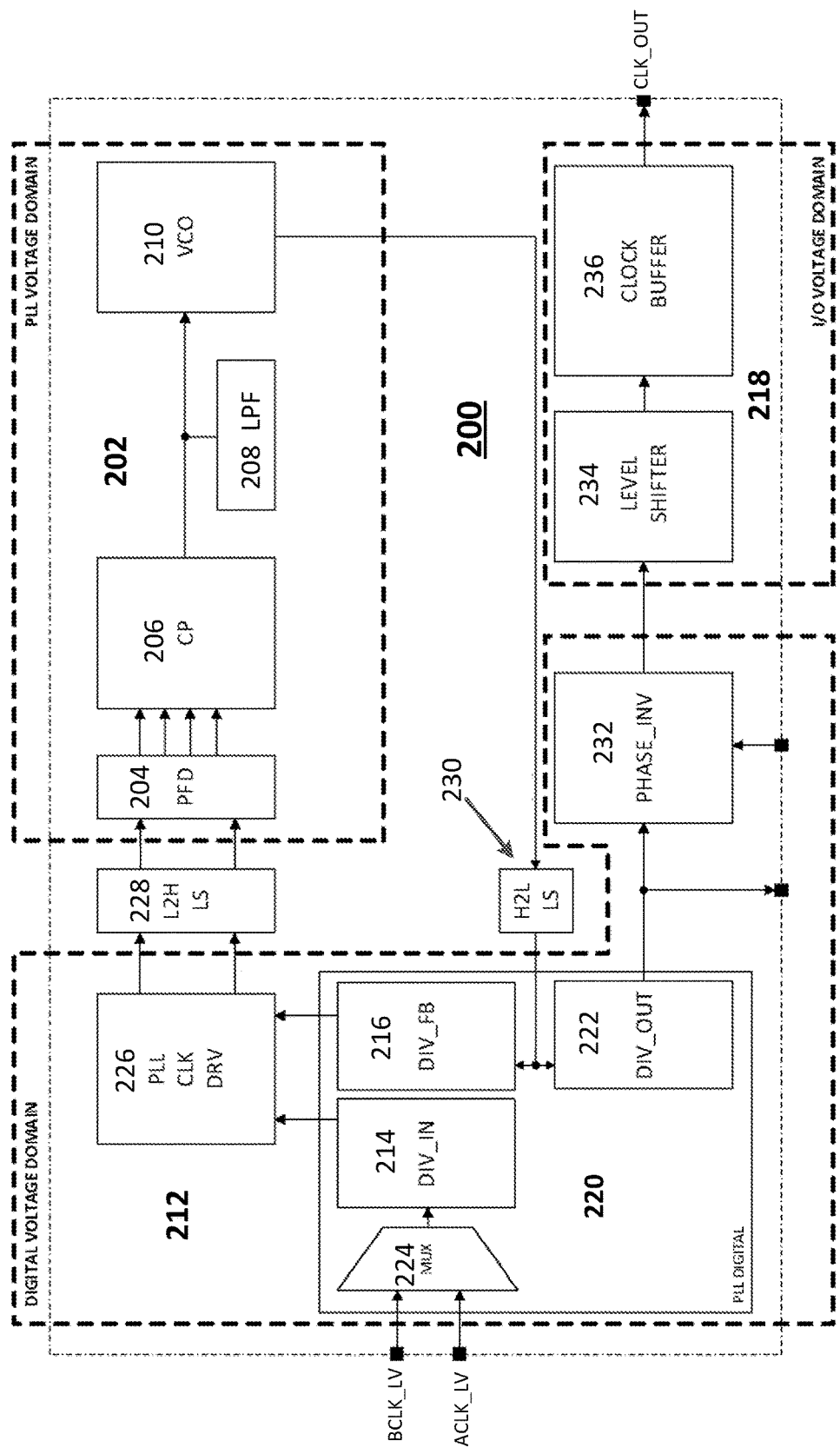
FIG. 2 is another block diagram of one type of phase-locked loop circuit as is known in the prior art.

FIG. 2 is a more detailed block diagram of one type of PLL circuit 200 as is known in the prior art. Circuit 200 again contains a PLL 202, a digital voltage circuit 212, and an output voltage circuit 218.

In circuit 200, digital voltage circuit 212 contains a module 220 that provides the divider functions shown in digital voltage circuit 112 in FIG. 1. Input divider module 220 includes an input clock divider 214 that functions similarly to the input divider 114 of circuit 100 in FIG. 1, a feedback clock divider 216, and an output clock divider 222. A multiplexor 224 selects between two input clocks ACLK_LV and BCLK_LV. As was the case with digital voltage circuit 112 of FIG. 1, these circuits are implemented in the digital voltage domain.

The input clock divider 214 and feedback clock divider 216 provide divided input and feedback clock signals to a PLL clock driver circuit 226 which in turn generates divided input and feedback clock signals to the PLL 202. (Again, in some implementations the input clock may be undivided, in which case ACLK_LV and BCLK_LV may be provided directly to PLL clock driver circuit 226 as a reference signal.) In the implementation illustrated in FIG. 2, these clock signals are level shifted from a low digital voltage level to a higher analog voltage level by a low-to-high level shifter 228 and then provided to phase detector 204; as will be clear to one of skill in the art in light of the teachings herein, if an implementation uses an analog voltage level that is lower than the digital voltage level, then the level shifters will be high-to low. However, as above, in other implementations the voltage level of the digital domain may be the same as the voltage level of the analog domain, in which case the level shifters are not necessary. As in circuit 100 of FIG. 1, the output of phase detector 204 is passed to a charge pump 206; the output of charge pump 206 is filtered by a low pass filter 208 and drives a VCO 210.

As described with reference to FIG. 1, VCO 210 outputs a clock signal at the higher voltage level in the analog domain which is then level shifted down to the lower digital domain voltage level by a high-to-low level shifter 230. The resulting loop feedback clock signal is passed to feedback clock divider 216 as described above, as well as to output clock divider 222. The output of output clock divider 222 is an output frequency signal, i.e., at the desired output frequency, and is then passed to a phase inverter 232, and from there to output voltage circuit 218.

Output voltage circuit 218 contains another level shifter 234 which changes the voltage level from the low voltage digital domain to a desired output level, and a clock buffer 236 that then outputs a clock output signal CLK_OUT.

As described above, jitter can arise from various sources. The power supply in the lower level digital voltage domain typically has noise, generally more noise than is present in the power supply in the PLL analog voltage domain. The logic level transitions of logic gates and flip-flops in the digital circuit can cause the amount of current needed on any given clock cycle to vary, and thus give rise to fluctuations in their supply voltage. Transition times can vary when a state change of a block differs due to voltage supply variations. All of these transitions cause jitter that can be considered as noise.

This noise contributes to jitter in the high-to-low and low-to-high transitions of the clock edges of the divided voltages provided by the input clock divider 214 and feedback clock divider 216 to the PLL clock driver 226, and this jitter is thus introduced into the closed-loop path of the PLL. (While, as above, in some implementations the input clock is not divided, the feedback clock is typically divided.) The level-shifters in the closed-loop path of the PLL can also introduce jitter into the PLL loop.

Figure 3:
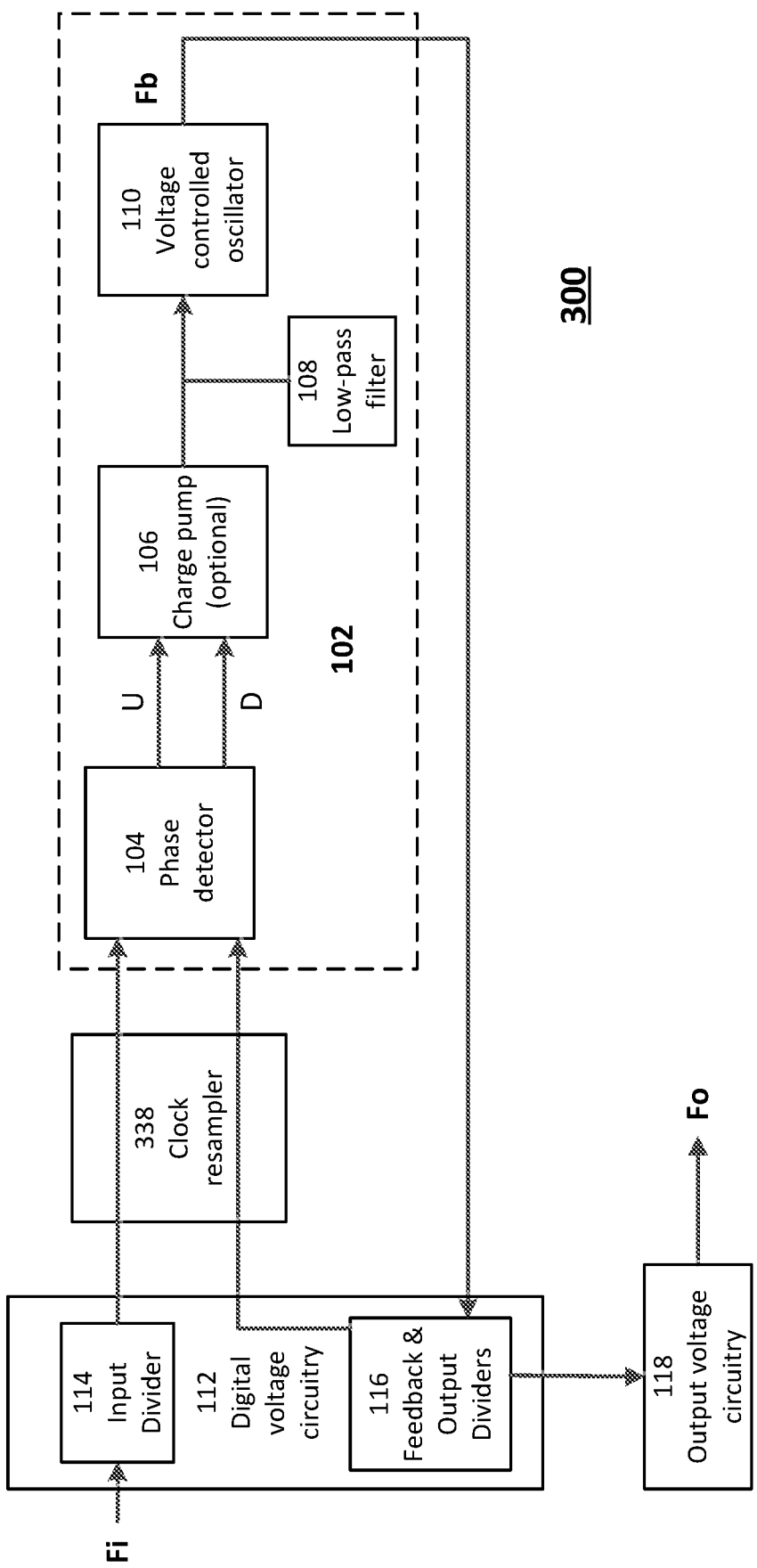
FIG. 3 is a block diagram of a phase-locked loop circuit according to one embodiment of the present approach.

FIG. 3 is a block diagram of one type of PLL circuit 300 according to the present approach. A number of the components of PLL circuit 300 are the same as in PLL circuit 100 of FIG. 1; circuit 300 again contains a PLL 102, a digital voltage circuit 112, and an output voltage circuit 118. However, in contrast to the prior art, to reduce jitter, PLL circuit 300 adds a clock resampler 338.

PLL 102 is again comprised of analog components, again containing phase detector 104, optional charge pump 106, low pass filter 108, and VCO 110, and operates as described above.

Digital voltage circuit 112 again receives the input clock signal Fi and divides it at input divider 114; however, in PLL circuit 300 the modified input clock is not simply divided and then level shifted before it is provided to phase detector 104 in PLL 102. Rather, the input clock is resampled at the higher voltage level of the analog PLL domain by clock resampler 318 before it is sent to phase detector 104 as a reference signal. (Again, the input clock signal Fi may be provided undivided, and thus not resampled, to phase detector 104 in some implementations.)

Similarly, the output Fb of VCO 110 is not simply level shifted, fed back to digital voltage circuit 112, and divided at feedback and output divider 116 before being fed to phase detector 104; rather, the divided feedback signal is also resampled by clock resampler 338 before being further processed by PLL 102 as described above.

As in PLL circuit 100, in PLL circuit 300 output voltage circuit 118 again receives an output frequency signal (i.e., a divided feedback clock signal) from the digital voltage circuit 112 and prepares it as clock output signal Fo. In some embodiments (as below) the output frequency signal may also be resampled by the clock resampler 338, but this is not within the feedback loop of PLL 102.

Figure 4:
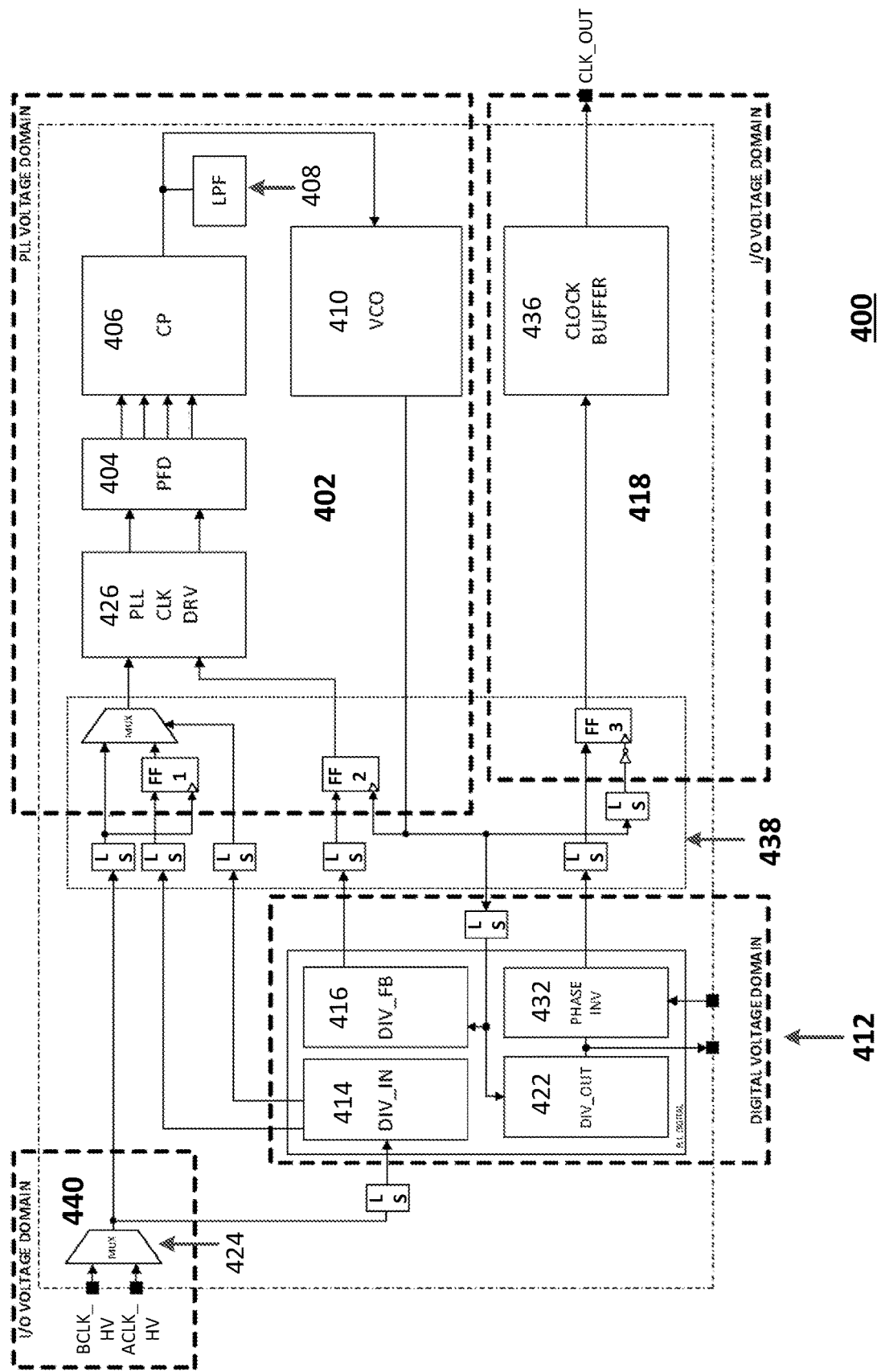
FIG. 4 is another block diagram of a phase-locked loop circuit according to one embodiment of the present approach.

FIG. 4 is a more detailed block diagram of one type of PLL circuit 400 according to the present approach. PLL circuit 400 contains a PLL 402, a digital voltage circuit 412, and an output voltage circuit 418 that perform somewhat similar functions to PLL 202, digital voltage circuit 212 and output voltage circuit 218 of PLL circuit 200, but vary in some material aspects as described further herein.

PLL circuit 400 reduces jitter by introducing a clock resampler 438 in the closed loop path of the PLL. As illustrated in FIG. 4, the voltage levels of the divided input and feedback clock signals from the digital voltage circuit 412 are converted to the voltage of the analog PLL domain by level shifters LS, and then the divided clock signals are resampled by flip-flops; if the input clock signal is not divided, it is converted to the voltage of the PLL domain but not resampled before being received as a reference signal by PLL clock driver 426 and then by phase detector 404. The entire closed loop path of PLL 402 is thus in the voltage domain of PLL 402, unlike the prior art shown in FIGS. 1 and 2 above, in which part of the loop is in the digital voltage domain. Again, however, in other embodiments the voltage of the digital domain may be the same as or even higher than the voltage of the analog domain. In either case, jitter from the digital voltage domain does not enter the PLL or is at least severely limited.

PLL 402 contains a phase detector 404, a charge pump 406, a low pass filter 408 and a VCO 410 which operate like the similar components in PLL 202 of PLL circuit 200 in FIG. 2. However, in PLL circuit 400 and according to the present approach, a PLL clock driver 426 operates in the analog domain; in contrast, PLL clock driver 226 of PLL circuit 200 of the prior art operates in the digital domain, thus helping to keep signals in the analog domain for phase comparison.

Digital voltage circuit 412 contains an input clock divider 414, a feedback clock divider 416, an output clock divider 422 and a phase inverter 432, which function in PLL circuit 400 in essentially the same way they function in PLL circuit 200 of FIG. 2. However, as above, PLL clock driver 426 is in the analog domain of PLL 402 rather than in the digital voltage circuit 412 in contrast to the operation of PLL circuit 200 described above.

As also illustrated in FIG. 4, a multiplexor 424, which selects between two input clocks ACLK_HV and BCLK_HV, is not within digital voltage circuit 412 (as multiplexor 224 was within digital voltage circuit 212 in FIG. 2) but rather is separated in an input clock circuit 440 in an I/O voltage domain; when the input clock is not divided, presenting the clock signal from the I/O voltage domain rather than allowing it to pass through the noisier digital voltage domain keeps the clock as clean as possible (in circuit 200 of FIG. 2 above, the input clocks pass through digital voltage circuit 212, thus requiring translation from one domain to another and subjecting them to the noise of digital voltage circuit 212).

In some instances, the input clock is divided by input clock divider 414 as was the case with input clock divider 214 in FIG. 2 in the prior art, which provides the desired divided frequency from the input clock. However, in PLL circuit 200 of FIG. 2 the divided input clock signal is sent directly to PLL clock driver 226; as above, both the input clock divider 414 and the level shifter LS will introduce jitter.

By contrast, in PLL circuit 400, at flip-flop FF1 the clock resampler 438 resamples the divided input clock from the input clock divider 414 using one of the input clock signals ACLK_HV and BCLK_HV as the undivided input reference clock, to produce the reference clock that is provided to PLL clock driver 426, which as described above is now located in PLL 402 rather than in digital voltage circuit 412. As above, avoiding the noisier digital domain and resampling the divided input clock signal using the higher frequency input clock helps to limit the jitter in the PLL 402 as much as possible. The prior art PLL circuit design of FIG. 2 does not resample the divided input clock signal using the undivided input reference clock.

Similarly, the loop feedback clock signal is divided by feedback clock divider 416, as is done by feedback clock divider 216 in PLL circuit 200, but in PLL circuit 400 again is not provided directly to PLL clock driver 426. Similarly to the divided input clock signal described above, the divided feedback clock is resampled at flip-flop FF2, again using a faster synchronous clock, which is now the high voltage level VCO output clock itself rather than the input clock, before the divided feedback clock signal is provided to PLL clock driver 426. The VCO output clock should be used to resample the divided feedback clock, because the VCO clock has a synchronous phase relationship with the divided feedback clock. Resampling the divided feedback clock with the input clock will not work as those clock signals are not synchronous. As with the input clock, the prior art PLL circuit 200 of FIG. 2 does not resample the divided feedback clock before the divided feedback clock is provided to PLL clock driver 226.

Resampling the divided input clock signal and divided feedback clock signal in this fashion results in "retiming" the clock edges, and removes much of the jitter introduced in the clock signals by the digital voltage circuit 412.

This makes the clock edges in PLL 402 very clean. Note that PLL 402 may run at frequencies measured in gigahertz (GHz); the highest frequency in the loop is the frequency of the VCO. As the output clock is often desired to be at a lower frequency than the frequency at which the PLL runs, the loop feedback clock signal is again typically divided by output clock divider 422, resulting in an output frequency signal. While output clock divider 422 is not in the feedback loop, it is in digital voltage circuit 412 and runs in the digital voltage domain, and will thus also introduce some jitter into the clock edges of the output signal.

For this reason, the output frequency signal from phase inverter 432 is also resampled, at flip-flop FF3, again using the high voltage level VCO output clock, and then provided to clock buffer 436 which then produces clock output signal CLK_OUT; as with the divided feedback signal, this provides an output clock signal with reduced jitter. Note that while the output frequency signal is level shifted in circuit 400, this is again not necessary, but rather it is the resampling in the input/output voltage domain that is important to reduce jitter. As with the divided input clock and divided feedback clock, the prior art PLL circuit 200 of FIG. 2 does not have a resampled output clock.

The resampling of the reference and feedback clocks thus removes any jitter that may be introduced by these signals which are in the digital voltage domain from entering the PLL closed-loop operating in the higher level analog voltage domain. This reduction in jitter of the PLL's output clock is seen in circuit simulation results, and system-level performance metrics measured in the lab also show a marked improvement using this approach.

Table 1 below shows the results of a simulation of the prior art circuit of FIG. 2 and the present approach circuit of FIG. 4. In each case the voltages are the same as noted in the table, and the frequencies of the relevant clock signals are the same, i.e., the input clock, the reference clock (which is the same frequency as the input clock), the VCO clock output, the feedback clock, and the output clock. As shown in the table, using the present approach, the amount of jitter, which is measured in picoseconds (ps), is reduced from 184 ps to 138 ps, a reduction of 25%.

TABLE 1

Example of simulation results:

| | Units | Using Prior Art (FIG. 2) | Using new design (FIG. 4) |
|---|---|---|---|
| Digital Voltage Domain | V | 1.2 | 1.2 |
| PLL Voltage Domain | V | 1.8 | 1.8 |
| I/O Voltage Domain | V | 3.3 | 3.3 |
| $f_{BCLK}$ | MHz | 3.072 | 3.072 |
| $f_{REFCLK}$ | MHz | 3.072 | 3.072 |
| $f_{VCOCLK}$ | MHz | 98.3 | 98.3 |
| $f_{FBCLK}$ | MHz | 3.072 | 3.072 |
| $f_{OUTCLK}$ | MHz | 12.288 | 12.288 |
| $J_{PIP, CLK\_OUT}$ | ps | 184 | 138 | where
$f_{BCLK}$ is the frequency of the input-clock, BCLK_LV (FIG. 2) or BCLK_HV (FIG. 4),
$f_{REFCLK}$ is the frequency of the reference clock into 226 in prior art, or 426 in FIG. 4,
$f_{VCOCLK}$ is the frequency of the VCO clock output from 210 in prior art, or 410 in FIG. 4,
$f_{FBCLK}$ is the frequency of the feedback clock into 226 in prior art, or 426 in FIG. 4,
$f_{OUTCLK}$ is the frequency of CLK_OUT.

Figure 5:
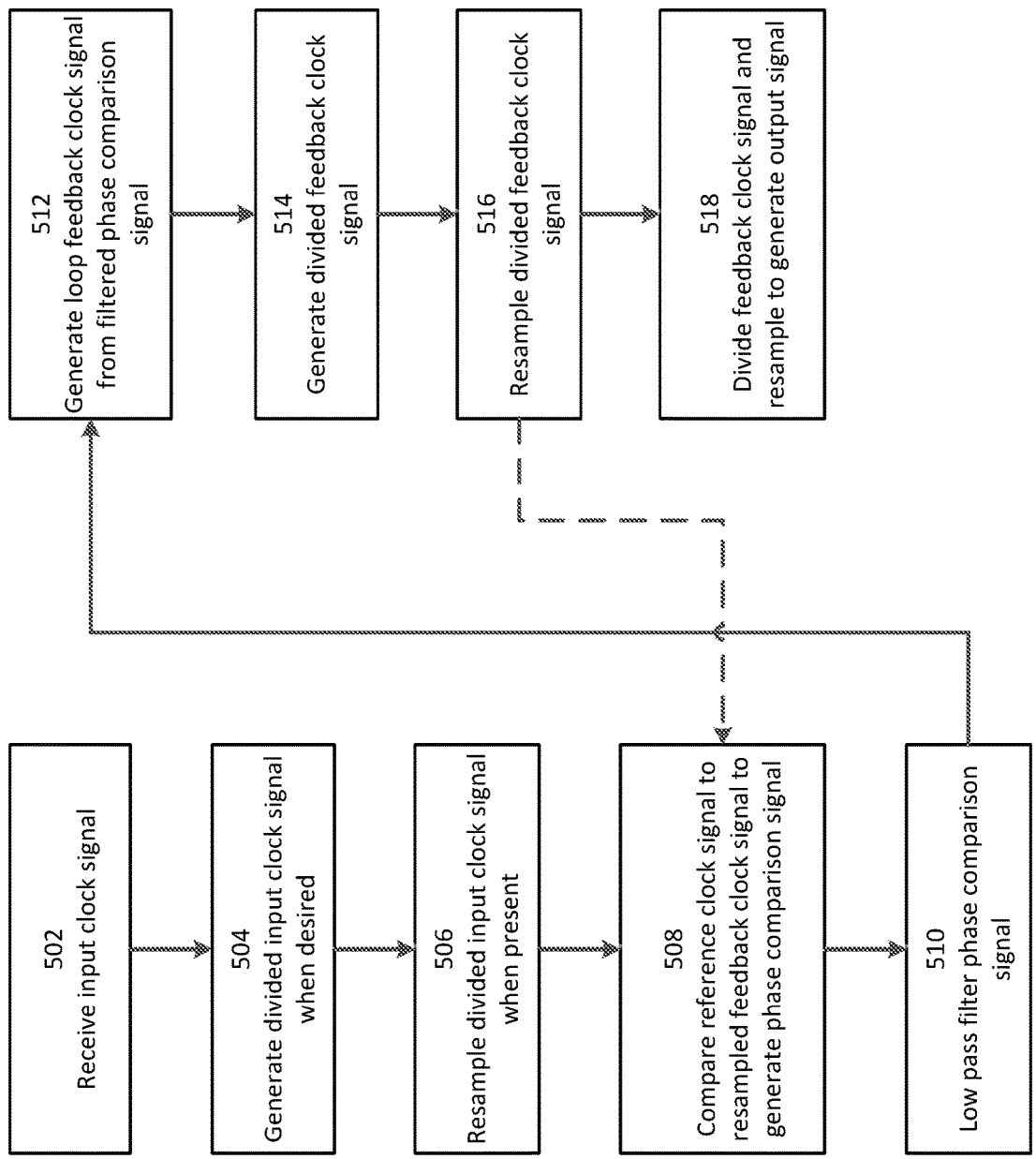
FIG. 5 is a flowchart of a method of operating a PLL circuit according to one embodiment of the present approach.

FIG. 5 is a flowchart of a method of operating a PLL circuit according to one embodiment of the present approach.

At step 502, the PLL circuit, such as PLL circuit 400 of FIG. 4, receives an input clock signal. If the reference signal is to be undivided, the input signal is passed on as the reference signal. If the input signal is to be divided to create the reference signal, the input signal is received at a digital voltage circuit such as digital voltage circuit 412.

If the input signal is to be divided, at step 504 the digital voltage circuit generates a divided input clock signal at a first voltage, for example, with a divider such as input clock divider 414 of FIG. 4.

If a divided input signal is present, at step 506, a resampling circuit, such as resampling circuit 438 of FIG. 4, resamples the divided input clock signal thereby generating a reference clock signal at a second voltage. A level shifter may be used to change the level of the divided input clock signal from one voltage, such as the low level digital domain voltage, to the second voltage, such as the analog level voltage of a PLL. Again, in some implementations the two voltage levels may be the same, in which case no level shifting is necessary.

At step 508, a phase comparator such as phase comparator 404 of FIG. 4 compares the phase of the reference clock signal to the phase of a resampled feedback clock signal, thereby generating a phase comparison signal.

At step 510, the phase comparison signal is filtered by a low pass filter such as low pass filter 408 of FIG. 4, thereby generating a filtered phase comparison signal.

At step 512, a voltage controlled oscillator, such as VCO 410 of FIG. 4, generates the loop feedback clock signal from the filtered phase comparison signal.

At step 514 the digital voltage circuit generates a divided feedback clock signal at a first voltage, for example, with a divider such as feedback clock divider 416 of FIG. 4.

At step 516, a resampling circuit, such as resampling circuit 438 of FIG. 4, resamples the divided feedback clock signal thereby generating a resampled feedback clock signal at the second voltage. Again, a level shifter may be used to change the level of the divided reference clock signal from one voltage, such as the low level digital domain voltage, to the second voltage, such as the analog level voltage of a PLL. As indicated by the dashed line in FIG. 5, the resampled feedback clock signal is passed back to a phase detector, such as phase detector 404 of FIG. 4 (through PLL clock driver 426) to do the phase comparison in step 508 above.

At step 518, the feedback clock signal is divided by, for example, output clock divider 422, creating an output frequency signal. In some embodiments, the output frequency signal may have its phase inverted, such as by phase inverter 432 of FIG. 4, and may then be resampled, such as by resampling circuit 438 of FIG. 4. A clock output signal is then generated from the output frequency signal.

The disclosed system has been explained above with reference to several embodiments. Other embodiments than the specific examples described herein will be apparent to those skilled in the art in light of this disclosure.

Certain aspects of the described method and apparatus may readily be implemented using configurations other than those described in the embodiments above, or in conjunction with elements other than or in addition to those described above. For example, as is well understood by those of skill in the art, the selection of components, clock frequencies, voltage levels, etc., is subject to design choices; one of skill in the art will appreciate that other components or structures may be used and will be able to select the appropriate set of elements and parameters that is appropriate for a particular application.

These and other variations upon the embodiments are intended to be covered by the present disclosure, which is limited only by the appended claims.

What is claimed is:

1. A phase-locked loop circuit comprising:
 a digital voltage circuit configured to:
  receive a loop feedback signal;
  generate a divided feedback signal at a first voltage level from the loop feedback signal; and
  generate an output frequency signal from the loop feedback signal;
 a clock resampling circuit configured to:
  receive the loop feedback signal and the divided feedback signal;
  generate a resampled feedback signal at a second voltage level which is different from the first voltage level by resampling the divided feedback signal using the loop feedback signal;
 an analog circuit feedback loop comprising:
  a phase detector configured to:
   receive a reference clock signal and the resampled feedback signal; and
   generate a phase comparison signal by comparing a phase of the reference clock signal to a phase of the resampled feedback signal;
  a low pass filter configured to receive and filter the phase comparison signal; and
  a voltage controlled oscillator configured to:
   receive the filtered phase comparison signal; and
   generate the loop feedback signal from the filtered phase comparison signal; and
 an output voltage circuit configured to generate a clock output signal from the output frequency signal.

2. The phase-locked loop circuit of claim 1 wherein the reference clock signal is an undivided signal.

3. The phase-locked loop circuit of claim 1 wherein:
 the digital voltage circuit is further configured to:
  receive an input clock signal from an input clock circuit; and
  generate a divided input clock signal at the first voltage level by dividing the input clock signal; and
 the clock resampling circuit is further configured to:
  receive the divided input clock signal and the input clock signal; and
  generate the reference clock signal at the second voltage level by resampling the divided input clock signal using the input clock signal.

4. The phase-locked loop circuit of claim 1 wherein:
 the clock resampling circuit is further configured to generate a resampled output frequency signal by resampling the output frequency signal; and
 the output voltage circuit is further configured to generate the output signal from the resampled output frequency signal.

5. The phase-locked loop circuit of claim 1 wherein the clock resampling circuit comprises a flip flop.

6. The phase-locked loop circuit of claim 3:
 wherein the resampling circuit that is configured to generate the resampled feedback signal by resampling the divided feedback signal using the loop feedback signal comprises a first flip flop configured to resample the divided feedback signal using the loop feedback signal; and
 wherein the clock resampling circuit that is further configured to generate the reference clock signal by resampling the divided input clock signal using the input clock signal comprises a second flip flop configured to resample the divided input clock signal using the input signal.

7. The phase-locked loop circuit of claim 3:
 wherein the digital voltage circuit that is further configured to generate the divided input clock signal at the first voltage level comprises a first level shifter; and
 wherein the clock resampling circuit that is further configured to generate the resampled feedback signal at the second voltage level comprises a second level shifter.

8. The phase-locked loop circuit of claim 1 further comprising:
a first level shifter configured to:
receive an input clock signal;
shift the input clock signal to a voltage level, thereby generating the reference clock signal; and
the clock resampling circuit further comprises a second level shifter configured to shift the divided feedback signal to the voltage level.

9. A method of operating a phase-locked loop circuit comprising:
receiving, at a digital voltage circuit, a loop feedback signal;
generating, by the digital voltage circuit, a divided feedback signal at a first voltage level from the loop feedback signal, and an output frequency signal from the loop feedback signal;
comparing, by a phase comparator, a phase of a reference clock signal to a phase of a resampled feedback signal, thereby generating a phase comparison signal;
filtering, by a low pass filter, the phase comparison signal, thereby generating a filtered phase comparison signal;
generating, by a voltage controlled oscillator, the loop feedback signal from the filtered phase comparison signal;
dividing, by the digital voltage circuit, the loop feedback signal, thereby generating the divided feedback signal;
resampling, by a resampling circuit, the divided feedback signal, thereby generating the resampled feedback signal at a second voltage level which is different from the first voltage level; and
generating a clock output signal from the output frequency signal.

10. The method of claim 9 wherein the reference clock signal is an undivided signal.

11. The method of claim 9 further comprising:
receiving, at the digital voltage circuit, an input clock signal from an input clock circuit;
generating a divided input clock signal at the first voltage level by dividing the input clock signal;
receiving, in the resampling circuit, the divided input clock signal and the input clock signal; and
generating the reference clock signal at the second voltage level by resampling the divided input clock signal using the input clock signal.

12. The method of claim 9 wherein generating an output signal from the output frequency signal further comprises:
resampling, by the resampling circuit, the output frequency signal; and
generating the output signal from the resampled output frequency signal.

13. The method of claim 9 wherein resampling the divided input clock signal is performed by a flip flop.

14. The method of claim 11 wherein resampling the divided input clock signal and the divided feedback signal comprises:
receiving the divided feedback signal and the loop feedback signal in a first flip flop, thereby causing the first flip flop to resample the divided feedback signal using the loop feedback signal; and
receiving the input clock signal and the divided input clock signal in a second flip flop, thereby causing the second flip flop to resample the divided input signal using the input signal.

15. The method of claim 11 further comprising:
shifting, by a first voltage level shifter, the divided input clock signal from the first voltage level to the second voltage level; and
shifting, by a second voltage level shifter, the divided feedback signal from the first voltage level to the second voltage level.

16. The method of claim 9 further comprising:
receiving an input clock signal;
shifting the input clock signal to a voltage level, thereby generating the reference clock signal; and
shifting the divided feedback signal to the voltage level before resampling the divided feedback signal.

* * * * *